United States Patent
Seväkivi et al.

(10) Patent No.: US 10,251,305 B2
(45) Date of Patent: Apr. 2, 2019

(54) COOLING ELEMENT FOR ELECTRONIC COMPONENTS AND ELECTRONIC DEVICE

(71) Applicant: ABB Technology Oy, Helsinki (FI)

(72) Inventors: Pertti Seväkivi, Lepsämä (FI); Niko Björkman, Klaukkala (FI); Juha Viljasalo, Nivala (FI)

(73) Assignee: ABB Schweiz AG, Baden (CH)

( * ) Notice: Subject to any disclaimer, the term of this patent is extended or adjusted under 35 U.S.C. 154(b) by 184 days.

(21) Appl. No.: 15/336,046

(22) Filed: Oct. 27, 2016

(65) Prior Publication Data
US 2017/0118868 A1    Apr. 27, 2017

(30) Foreign Application Priority Data
Oct. 27, 2015  (EP) ..................... 15191675

(51) Int. Cl.
*H05K 7/20* (2006.01)
*H01L 23/473* (2006.01)
*H01L 25/07* (2006.01)

(52) U.S. Cl.
CPC ....... *H05K 7/20218* (2013.01); *H01L 23/473* (2013.01); *H01L 25/07* (2013.01); *H05K 7/20927* (2013.01)

(58) Field of Classification Search
CPC ........... H05K 7/20218; H05K 7/20927; H01L 25/07; H01L 23/473
USPC ................................................ 361/699–722
See application file for complete search history.

(56) References Cited

U.S. PATENT DOCUMENTS

| | | | | |
|---|---|---|---|---|
| 5,514,906 A | * | 5/1996 | Love | H01L 23/473 257/712 |
| 5,526,231 A | * | 6/1996 | Arz | F28D 20/0039 257/E23.098 |
| 6,501,172 B1 | | 12/2002 | Fukada et al. | |
| 2003/0132042 A1 | * | 7/2003 | Beihoff | B60L 11/12 180/65.1 |

(Continued)

FOREIGN PATENT DOCUMENTS

| | | |
|---|---|---|
| CN | 201204783 Y | 3/2009 |
| CN | 204206713 U | 3/2015 |
| EP | 2613351 A1 | 7/2013 |

OTHER PUBLICATIONS

European Search Report, EP15191675.6, dated Apr. 5, 2016, ABB Technology Oy, 6 pages.

(Continued)

*Primary Examiner* — Anthony M Haughton
*Assistant Examiner* — Yahya Ahmad
(74) *Attorney, Agent, or Firm* — J. Bruce Schelkopf; Taft Stettinius & Hollister LLP

(57) ABSTRACT

A cooling element comprising a cooling body, the cooling body comprising a first surface and a second surface, the first surface and the second surface being on the opposing sides of the body and the distance between the first and second surfaces defining the height of the cooling body, multiple of channels for cooling liquid arranged inside the cooling body, the channels extending in a longitudinal direction of the cooling body, wherein the channels are arranged in two layers in the direction of the height of the cooling body inside the cooling body and the cooling element is adapted to hold electronic components on the first surface and on the second surface for cooling electronic components on both surfaces.

15 Claims, 2 Drawing Sheets

(56) References Cited

U.S. PATENT DOCUMENTS

| | | | |
|---|---|---|---|
| 2009/0129011 A1* | 5/2009 | Balzano ................ | H01L 23/473 361/689 |
| 2009/0178788 A1 | 7/2009 | Kimura | |
| 2011/0249402 A1* | 10/2011 | Hentschel ............. | H01L 23/473 361/699 |
| 2013/0233523 A1* | 9/2013 | Parida ................. | H01L 23/4735 165/109.1 |
| 2016/0286693 A1* | 9/2016 | Chester .............. | H05K 7/20772 |
| 2017/0006735 A1* | 1/2017 | Shibasaki ............. | H01L 23/473 |

OTHER PUBLICATIONS

Chinese Office Action dated Aug. 20, 2018; CN Application No. 201610926090.6; Applicant: ABB Technology Oy; 19 pgs. (including translation).

* cited by examiner

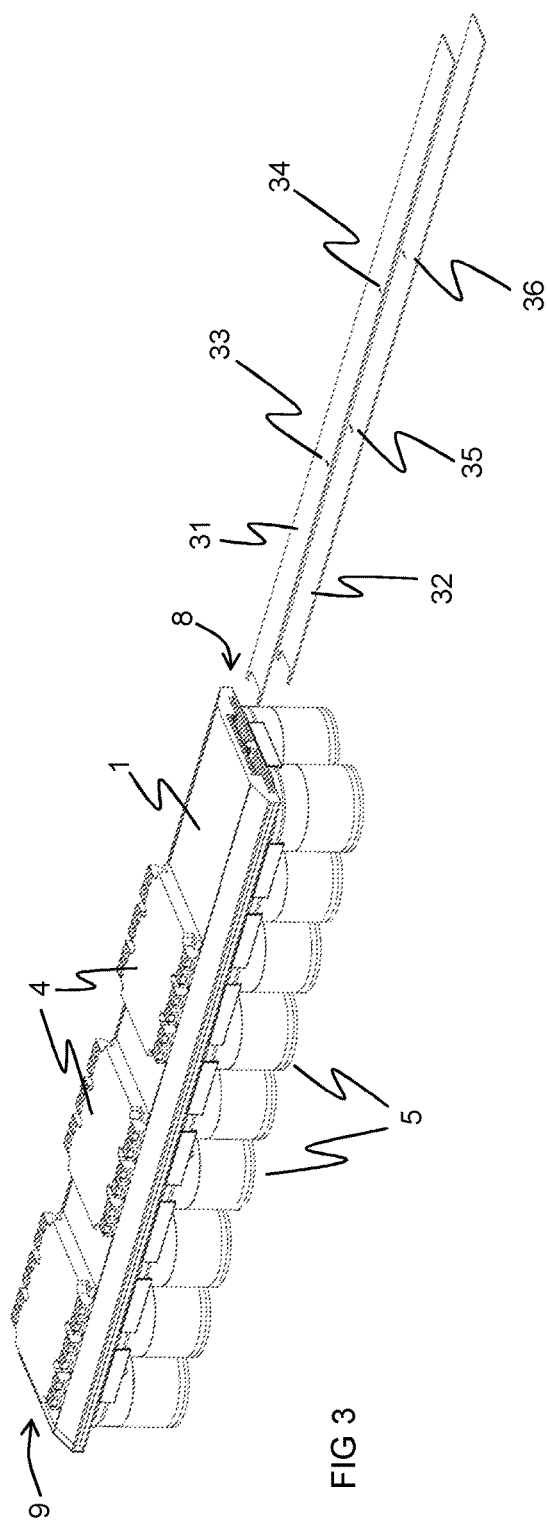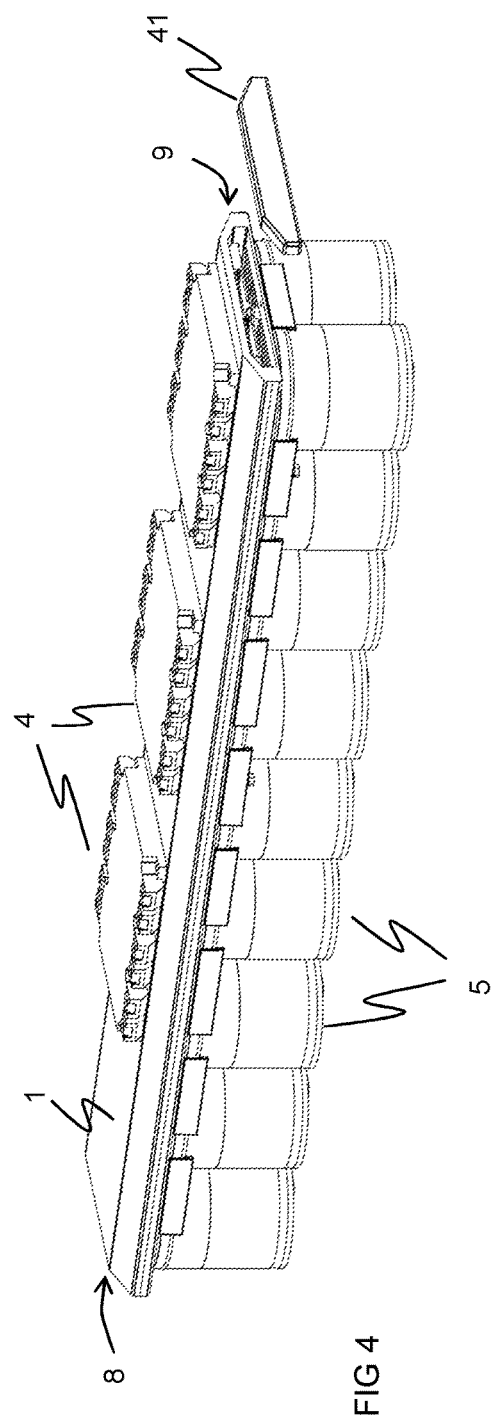

COOLING ELEMENT FOR ELECTRONIC COMPONENTS AND ELECTRONIC DEVICE

FIELD OF THE INVENTION

The present invention relates to a cooling element, and particularly to a cooling element with liquid circulation for electronic components.

BACKGROUND OF THE INVENTION

Both active and passive electronic components generate heat when used in electronic circuits. Especially switching converter devices generate heat due to high currents and voltages. For example in a voltage source inverter the output voltage is formed by connecting either negative or positive voltage of a DC-voltage link to the output of the device using multiple of semiconductor switches. The semiconductor switches are operated with a high frequency for producing desired output voltage. Although the semiconductor switches are controlled from fully blocking state to fully conducting state (and vice versa) losses are incurring in the switches during the switching instants. Losses are also generated while the semiconductor switches are conducting.

The DC voltage in the DC-voltage link is sustained using one or more capacitors connected across the negative and positive voltages. When the switches are operated and the output current is changed due to changed state of semiconductors switches, a current is drawn from the capacitors of the DC-link. Thus the capacitors are constantly discharged and charged when the device is in operation and such capacitor ripple current causes the capacitors to heat.

Other types of passive components that heat up during the use of a voltage source inverter are inductive components. Inductive components are employed as filters to reduce the current ripple and to block high-frequency disturbances from entering to supplying network. The inductive components generate heat as losses are incurring in the magnetic core material when the magnetic flux changes. As current flows through the coil of the inductive components, resistive losses are also produced.

The generated losses heat up the components themselves and also neighbouring and surrounding components. It is known that elevated temperature of the components affects directly to the lifetime of the components. In the worst case, excessive temperature may also directly cause malfunction or destruction of the components.

The heat generated by the components is typically removed from the components by providing different cooling elements which absorb and spread the heat and further dissipate the heat in controlled manner. For example heat sinks may be attached to heat generating components such that the heat from components is led to the heat sink and further removed from the heat sink outside the enclosure of the device in controlled manner. In heat sinks with liquid circulation the heat from the components is led to a circulating liquid and the heat from the liquid is removed at a desired location.

A problem relating to liquid cooling of electronic devices or components is that the heat sinks with conduits for liquids are large in size and require a piping arrangement for leading the cooling liquid to the conduits of the heat sink. Especially if an electronic device comprises multiple of components that require cooling, the arrangement for liquid cooling takes a considerable amount of space inside the housing of the device as multiple of liquid cooled heat sinks are employed.

BRIEF DESCRIPTION OF THE INVENTION

An object of the present invention is to provide a cooling element so as to alleviate the above disadvantages. The object of the invention is achieved by a cooling element which is characterized by what is stated in the independent claim. The preferred embodiments of the invention are disclosed in the dependent claims.

The invention is based on the idea of employing a cooling element with multiple channels for cooling liquid. The channels of the cooling element are arranged to the cooling body of the cooling element in two layers such that both surfaces of the cooling element can be used for cooling electronic components.

The advantages of the cooling element of the invention are obtained with an electronic device of the invention that incorporates the cooling element.

In a preferred embodiment the upper and lower channels are connected in one end of the cooling body such that the cooling liquid may flow in both upper and lower channels and the inlet and the outlet are situated at the same end of the cooling element.

An advantage of the cooling element of the invention is that the number of separate cooling elements is reduced as both surfaces of the cooling element are adapted to receive electronic components for cooling the components. Further, when the inlet and the outlet are arranged to the same end of the cooling element, the piping can be simplified while maintaining effective cooling with both surfaces.

According to another embodiment, the cooling element comprises one or more liquid connections arranged inside the cooling body between at least one upper channel and a lower channel. Such liquid connections enable to balance the temperatures of the cooled components.

According to another embodiment, the connections between the upper and lower channels are produced with insert pieces that are inserted between the upper and lower channels. Such insert pieces enable effective manufacture of the liquid connections.

BRIEF DESCRIPTION OF THE DRAWINGS

In the following the invention will be described in greater detail by means of preferred embodiments with reference to the attached drawings, in which

FIG. 3 shows the embodiment of FIG. 1 with insert pieces; and

FIG. 4 shows the embodiment of FIG. 1 with end piece.

DETAILED DESCRIPTION OF THE INVENTION

Figure 1:
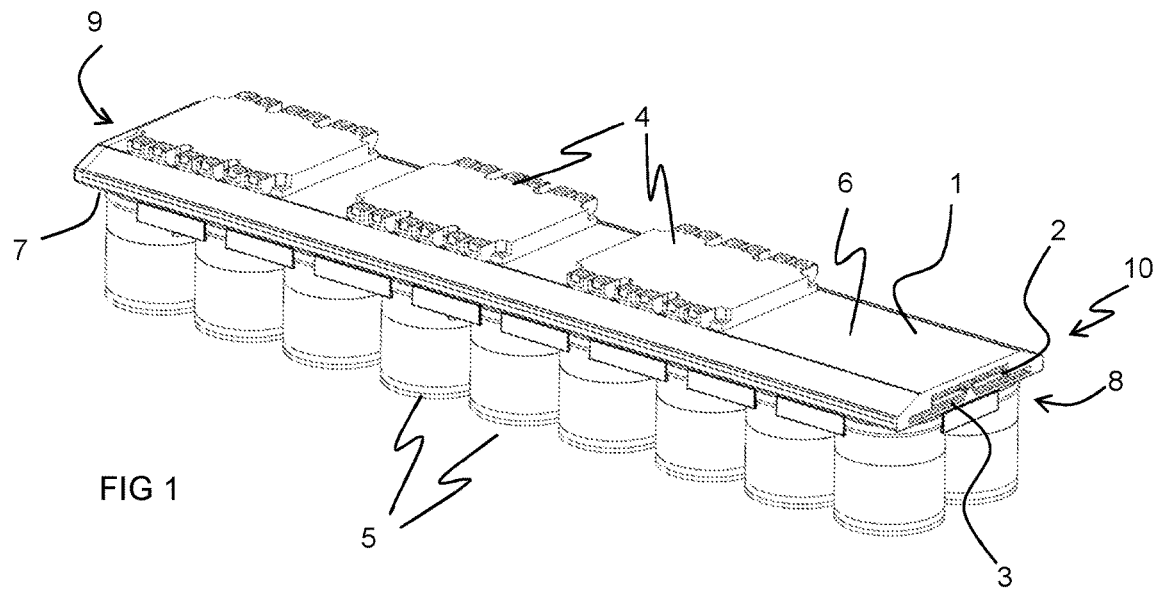
FIG. 1 shows an embodiment of the cooling element with electronic components.
Figure 2:
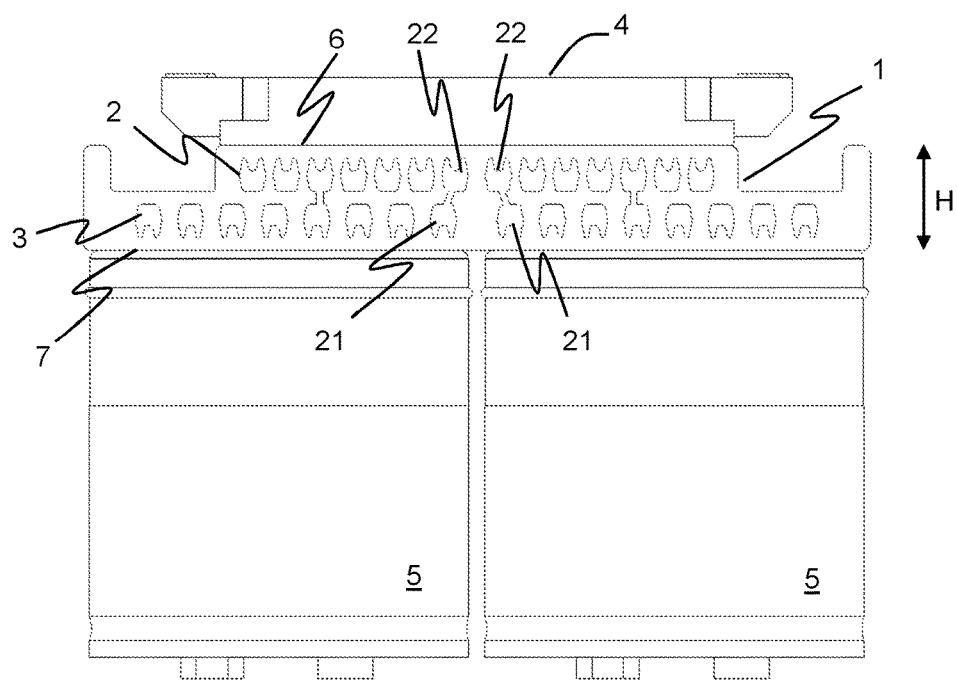
FIG. 2 shows a cross-section of the cooling element of an embodiment of the invention.

FIG. 1 shows a perspective view of an embodiment of the cooling element 10 of the invention with electronic components 4, 5 attached to the cooling element and FIG. 2 shows a cross section of the cooling element of FIG. 1 together with the attached components. The cooling element of the invention comprises a cooling body 1. The cooling body is a metallic component which has a first surface 6 and a second surface 7 to which electronic components can be attached.

FIGS. 1 and 2 show power electronic switch modules 4 attached to the first surface 6 of the cooling body and multiple of capacitors 5 attached to the opposing side of the body forming the second surface 7 of the cooling body.

In the cooling element, the cooling body comprises multiple of channels 2, 3 for cooling liquid. The channels are shown in FIG. 1 as a large channels whereas the cross section of FIG. 2 shows in detailed manner the formation of separate channels. The channels are extending in longitudinal direction of the cooling body inside the cooling body.

According to the present invention, the channels are arranged in two layers and the two layers are in the direction of the height H of the cooling body. The layers in the direction of the height mean that one set of channels is closer to the first surface than the other set of channels. In other words, the channel layers are formed in such a manner, that one layer of channels is close to the first surface of the cooling body and the other layer of channels is close to the second surface of the cooling body. The channels inside the cooling body extend substantially parallel to the surfaces of the cooling body.

In the present invention, the cooling element is adapted to hold or carry electronic components on the first surface and on the second surface for cooling the mentioned components. As mentioned above, FIGS. 1 and 2 show embodiments in which power electronic switch modules 4 are attached to first surface of the cooling body and multiple of capacitors are attached to the second surface of the cooling body.

In the invention, upper channels, i.e. the layer of channels closest to the first surface of the cooling body are cooling the components attached to the first surface and, correspondingly, the lower channels are cooling the components attached to the second surface when cooling liquid is circulated through the channels.

The circulation of cooling liquid in the channels is preferably carried out in such a manner that the cooling liquid is inputted in one of the layers from first end 8 of the cooling body. According to an embodiment, the channels are connected at the second end 9 of the cooling body such that the flow of cooling liquid is guided to the other layer. The cooling liquid then returns via the other layer to the same end of the cooling body as it was inserted, i.e. to the first end. The referred first end and second end are the ends of the cooling body in the longitudinal direction. As the channels inside the cooling body are running along the length of the cooling body, the channels are also extending from the first end to the second end.

According to a preferred embodiment, the channels of the two layers are connected at the second end 9 using an end piece 41 shown in FIG. 4 without attachment to the cooling body. The end piece 41 produces a flow path for the cooling liquid such that the cooling liquid is led from one layer to the other layer. The end piece may be in a form of a cap or similar structure that surrounds the ends of the channels of the both layers and thereby forms a passage for the cooling liquid at the end of the cooling body.

In one embodiment of the invention, at least one channel of the upper layer is in fluid communication with a channel of the lower layer at least in one position inside the cooling body. FIG. 2 shows how a channel of the upper layer 22 is thus connected to a channel of the lower layer 21 inside the cooling element such that the cooling liquid is able to flow between the channels. FIG. 2 is thus a cross section of the cooling body in the position of the connection hole between the channels. As the channels are connected inside the cooling element i.e. in a point along the length of the channel, part of the cooling liquid does not flow the whole length of the channel. With such a hole between an upper and a lower channel the temperatures of the cooled electronic components can be kept more balanced. Preferably, multiple of these apertures or holes are produced between the upper and the lower channels. For example, two different channels of the upper layer may by connected with two holes with respective two different channels of the lower layer, that is, two pairs of upper and lower channels are connected with two connection holes allowing the liquid to pass from one channel to another.

According to an embodiment, the connection between the channels inside the cooling body is carried out using a cooling body in which at least one upper channel is open to a lower channel within the whole length of the channels. The cooling body further has an opening that extends through the cooling body in the longitudinal direction. The opening is formed between the upper channel and the lower channel which are open to each other. The cooling element of the embodiment further comprises at least one insert piece 31, 32 which can be inserted to the opening from the first or the second end of the cooling body. The insert piece closes the longitudinal sides of the open upper and lower channels and has one or more holes or apertures which form the liquid passages between the channels inside the cooling body. Thus the insert piece closes the sides of upper and lower channels which are open for the most of the length of the channels. At the same time, the holes of the insert piece provide liquid passages between the upper and lower channels. It is clear that the position of holes in the insert piece must match the open channels in the direction of the width of insert piece.

FIG. 2 can be considered to represent a cross section at an arbitrary position when the upper and lower channels 21, 22 are open to each other within the whole length of the channels. FIG. 2 does not show insert pieces or the opening that extends between the channels. The upper channels, lower channels and the insert piece may also be structured in such a manner, that the insert piece closes completely multiple of upper and lower channels, and provides a liquid hole or holes between desired channels. That is, when the insert piece is put in place, the insert piece forms lower surfaces of the upper channels and upper surfaces of lower channels. With such arrangement the cooling element can be greatly modified by using different insert pieces with holes in different positions.

FIG. 3 shows an embodiment of the invention with two insert pieces 31, 32 removed from their installed position. The insert pieces are installed to the cooling body from the end of the cooling body by pushing the insert pieces to the longitudinal opening of the cooling body. The insert pieces are shown with the openings 33, 34, 35, 36 which form the liquid pass holes between channels of upper layer and lower layer.

The holes in the insert pieces are positioned in longitudinal direction is such a manner that the cooling of the components is uniform. The cooling liquid, such as water, is inputted at the first end to the channels of the lower layer. The lower layer is mainly cooling the capacitors attached to the second surface of the cooling body. As the cooling liquid travels along the length of the cooling body, it is heated by the heat from the capacitors. The same heated water flows back to the first end in the channels of the upper layer and heats even more during the flow. As the water is warmer near or under the components on the first surface that are closest to the first end of the cooling body, the heat removal from the components is not as effective as with the components near the second end. For equalling the temperatures of the components attached to the first surface, the holes 33, 34, 35, 36 that are arranged inside the cooling body let a portion of the cooler water to pass to the channels of the upper layer. The holes are preferably arranged in such a manner, that cooler water flow to the upper channel at the position or near the position of the components that generate heat. In the example of FIG. 3, the holes are positioned in such a manner, that water from the lower layer can be transferred to the upper layer approximately under the power semiconductor switch modules.

As shown in FIG. 3, the insert piece or insert pieces are thin strips that are preferably fabricated from the same material as the cooling body.

In the example of the drawings, the components attached to the cooling element are capacitors and semiconductor switches or switch modules. The switches or switch modules 4 operate at higher temperatures than the capacitors 5. As the cooling liquid is passed first through the channels that are closest to the capacitors, the heat from the switch components is not able to heat the capacitors.

The cooling body of the cooling element is simple to manufacture as the body is formed of a profile that is consistent throughout the whole length of the body when the insert pieces are used to produce the liquid passages between the channels inside the cooling body. Further, some modification to the cooling element can be carried out by modifying the insert pieces. For example, when different power switch components or modules are used, the dimensions of the modules may be taken into account by changing the position of the holes.

According to an embodiment, at least one surface of the cooling body comprises a coating with a material having a good thermal conductivity and low electrical conductivity. Materials with such properties include, for example, polytetrafluoroethylene (PTFE), which is known by commercial name Teflon by DuPont Co. Such coating applied to at least one surface of the cooling body helps in transferring heat from the components to the cooling element. Further, as the coating has low electrical conductivity and is preferably electrically insulating, the insulation of the cooled components from the cooling body is enhanced.

In the above, the operation of the cooling element is described in connection with an example having capacitors and power electronic switch modules as the components to be cooled. However, the structure and shape of the cooling element enables it to be used for cooling of any electrical components. Further, the invention and the embodiments disclosed above and shown in the drawings relate to a structure in which the cooling surfaces of the cooling element are nearly planar and straight. However, the shape of the cooling element is not restricted to the presented embodiments.

The invention relates also to an electronic device comprising a cooling element according to any one of the previous claims. The device is preferably a converter comprising power semiconductor switch components and capacitors, the cooling element being adapted to hold the power semiconductor switch component on one first surface of the cooling element and capacitors on the second surface of the cooling element. As the converter of the embodiment comprises a liquid cooled two sided cooling element, the device can be made compact in size.

It will be obvious to a person skilled in the art that, as the technology advances, the inventive concept can be implemented in various ways. The invention and its embodiments are not limited to the examples described above but may vary within the scope of the claims.

The invention claimed is:

1. A cooling element comprising a cooling body,
the cooling body comprising a first surface and a second surface, the first surface and the second surface being on the opposing sides of the body and the distance between the first and second surfaces defining the height of the cooling body,
multiple of channels for cooling liquid arranged inside the cooling body, the channels extending in a longitudinal direction of the cooling body, wherein
the channels are arranged in two layers in the direction of the height of the cooling body inside the cooling body and the cooling element is adapted to hold electronic components on the first surface and on the second surface for cooling electronic components on both surfaces,
wherein channels of the separate layers of the cooling body are formed as upper and lower channels, whereby at least one of the upper channels is arranged to be in liquid communication to a lower channel at least in one position inside the cooling body,
wherein the cooling body comprises
at least one upper channel which is open to a lower channel within the whole length of the channels, and
an opening extending through the cooling body in the longitudinal direction of the cooling body, the opening being arranged between the at least one upper channel which is open to a lower channel and the mentioned lower channel, wherein
the cooling element comprises at least one insert piece adapted to be inserted to the opening of the cooling body, and the at least one insert piece comprises at least one hole, whereby the insert piece is adapted to separate the at least one upper channel from the lower channel and to provide liquid communication between the at least one upper channel and the lower channel through the at least one hole of the insert piece.

2. A cooling element according to claim 1, wherein the channels comprise an inlet for inputting cooling liquid to the channels and an outlet for outputting the cooling liquid from the channels, the inlet and the outlet being arranged at a first end of the cooling body and the channels of the two layers are connected at the second end of the cooling body, the first end and the second end of the cooling body delimiting the longitudinal direction of the cooling body.

3. A cooling element according to claim 2, wherein the inlet and the outlet are arranged at separate layers.

4. A cooling element according to claim 2, wherein the channels of the two layers extend from the first end of the cooling body to the second end of the cooling body and the channels of the two layers are connected with an end piece attached to the second end of the cooling body, the end piece being adapted to produce a flow path for the cooling liquid.

5. A cooling element according to claim 1, wherein the cooling body comprises two upper channels which are open to corresponding two lower channels within the whole length of the channels.

6. A cooling element according to claim 5, wherein the cooling body comprises two insert pieces adapted to be inserted to the opening of the cooling body.

7. A cooling element according to claim 1, wherein at least one of the surfaces of the cooling body comprises a coating with a material having a good thermal conductivity and a low electrical conductivity.

8. A cooling element according to claim 7, wherein the coating material is polytetrafluoroethylene.

9. An electronic device comprising:

a cooling element comprising a cooling body, the cooling body comprising a first surface and a second surface, the first surface and the second surface being on the opposing sides of the body and the distance between the first and second surfaces defining the height of the cooling body, multiple of channels for cooling liquid arranged inside the cooling body, the channels extending in a longitudinal direction of the cooling body, wherein the channels are arranged in two layers in the direction of the height of the cooling body inside the cooling body and the cooling element is adapted to hold electronic components on the first surface and on the second surface for cooling electronic components on both surfaces, wherein channels of the separate layers of the cooling body are formed as upper and lower channels, whereby at least one of the upper channels is arranged to be in liquid communication to a lower channel at least in one position inside the cooling body, wherein the cooling body comprises at least one upper channel which is open to a lower channel within the whole length of the channels, and an opening extending through the cooling body in the longitudinal direction of the cooling body, the opening being arranged between the at least one upper channel which is open to a lower channel and the mentioned lower channel, wherein the cooling element comprises at least one insert piece adapted to be inserted to the opening of the cooling body, and the at least one insert piece comprises at least one hole, whereby the insert piece is adapted to separate the at least one upper channel from the lower channel and to provide liquid communication between the at least one upper channel and the lower channel through the at least one hole of the insert piece.

10. An electronic device according to claim 9, wherein the electronic device is an inverter comprising power semiconductor switch components and capacitors, the cooling element being adapted to hold the power semiconductor switch component on one side of the cooling element and capacitors on the other side of the cooling element.

11. A cooling element comprising a cooling body, the cooling body comprising a first surface and a second surface, the first surface and the second surface being on the opposing sides of the body and the distance between the first and second surfaces defining the height of the cooling body, multiple of channels for cooling liquid arranged inside the cooling body, the channels extending in a longitudinal direction of the cooling body, wherein the channels are arranged in two layers in the direction of the height of the cooling body inside the cooling body and the cooling element is adapted to hold electronic components on the first surface and on the second surface for cooling electronic components on both surfaces;

wherein the channels comprise an inlet for inputting cooling liquid to the channels and an outlet for outputting the cooling liquid from the channels, the inlet and the outlet being arranged at a first end of the cooling body and the channels of the two layers are connected at the second end of the cooling body, the first end and the second end of the cooling body delimiting the longitudinal direction of the cooling body;

wherein the inlet and the outlet are arranged at separate layers;

wherein the channels of the two layers extend from the first end of the cooling body to the second end of the cooling body and the channels of the two layers are connected with an end piece attached to the second end of the cooling body, the end piece being adapted to produce a flow path for the cooling liquid, wherein channels of the separate layers of the cooling body are formed as upper and lower channels, whereby at least one of the upper channels is arranged to be in liquid communication to a lower channel at least in one position inside the cooling body, wherein the cooling body comprises at least one upper channel which is open to a lower channel within the whole length of the channels, and an opening extending through the cooling body in the longitudinal direction of the cooling body, the opening being arranged between the at least one upper channel which is open to a lower channel and the mentioned lower channel, wherein the cooling element comprises at least one insert piece adapted to be inserted to the opening of the cooling body, and the at least one insert piece comprises at least one hole, whereby the insert piece is adapted to separate the at least one upper channel from the lower channel and to provide liquid communication between the at least one upper channel and the lower channel through the at least one hole of the insert piece.

12. A cooling element according to claim 11, wherein the cooling body comprises two upper channels which are open to corresponding two lower channels within the whole length of the channels.

13. A cooling element according to claim 12, wherein the cooling body comprises two insert pieces adapted to be inserted to the opening of the cooling body.

14. A cooling element according to claim 13, wherein at least one of the surfaces of the cooling body comprises a coating with a material having a good thermal conductivity and a low electrical conductivity.

15. A cooling element according to claim 14, wherein the coating material is polytetrafluoroethylene.

* * * * *